United States Patent [19]

Katoh

[11] Patent Number: 5,032,960

[45] Date of Patent: Jul. 16, 1991

[54] LIGHT SOURCE DEVICE WITH ARRAYED LIGHT EMITTING ELEMENTS AND MANUFACTURING THEREFOR

[75] Inventor: Masaaki Katoh, Osaka, Japan

[73] Assignee: Sharp Kabushiki Kaisha, Osaka, Japan

[21] Appl. No.: 480,141

[22] Filed: Feb. 14, 1990

[30] Foreign Application Priority Data

Feb. 15, 1989 [JP] Japan .................... 1-37279

[51] Int. Cl.$^5$ .............................................. F21V 21/00
[52] U.S. Cl. .................... 362/240; 362/244; 362/250; 362/800; 355/70
[58] Field of Search ............... 362/800, 240, 235, 245, 362/249, 252, 241, 244; 355/70, 228, 229; 357/72

[56] References Cited

U.S. PATENT DOCUMENTS

| | | | |
|---|---|---|---|
| 4,630,180 | 12/1986 | Muraki et al. | 362/241 |
| 4,698,730 | 10/1987 | Sakai et al. | 362/800 |
| 4,742,432 | 5/1988 | Thillays et al. | 362/800 |
| 4,847,734 | 7/1989 | Katoh et al. | 362/249 |
| 4,878,107 | 10/1989 | Hopper | 357/72 |
| 4,884,178 | 11/1989 | Roberts | 362/249 |
| 4,901,207 | 2/1990 | Sato et al. | 362/800 |
| 4,908,743 | 3/1990 | Miller | 362/249 |
| 4,941,072 | 7/1990 | Yasumoto et al. | 362/800 |

*Primary Examiner*—Ira S. Lazarus
*Assistant Examiner*—Richard R. Cole

[57] ABSTRACT

A light source device with arrayed light emitting elements includes a base board on which a plurality of the light emitting elements are arranged in an array, a convergent rod lens provided parallel to the array of the light emitting elements, and a reflection casing for holding the convergent lens. The convergent lens and the reflection casing are integrally connected with an air-gap formed parallel to the cnvergent lens. The base board is secured upon being inserted into the air-gap. The convergent lens and reflection casing in the light source device with arrayed light emitting elements can integrally and simultaneously be molded by continuous two-color extrusion molding. Therefore, it is possible to manufacture the light source device with arrayed light emitting elements at lower cost and which can easily be assembly with a reduced number of parts.

13 Claims, 7 Drawing Sheets $n_1 < n_3 < n_2$ $\theta_{c1} < \theta_{c2}$

LIGHT SOURCE DEVICE WITH ARRAYED LIGHT EMITTING ELEMENTS AND MANUFACTURING THEREFOR

BACKGROUND OF THE INVENTION

1. Field of the Invention

This invention relates generally to light source devices with arrayed light emitting elements, and more particularly to a light source device with arrayed light emitting elements, employed as a light source for reading image information in an adhesion type image sensor, an optical image reader, a contraction type image sensor or the like, and a manufacturing method thereof.

2. Description of the Background Art

In reading image information, in optical image readers, facsimile devices, copiers, various kinds of optical checking devices and the like, light from a light source is directed onto a surface o a document or that of an object to be checked, and the reflected light is then subject to photoelectric conversion by employing an adhesion type image sensor, a linear image sensor, a CCD or the like to be inputted as information. A light emitting diode element (hereinafter referred to as LED) which is superior in reliability and life has been in wider use as the light source.

Since a simple LED emits a small quantity of light and thus is only capable of local illumination, a light emitting element array (hereinafter referred to as an LED array) including a plurality of LEDs linearly arranged is commonly used.

The structure of a conventional LED array employing LED chips is shown in FIGS. 1A–1C. Referring to these figures, the conventional LED array comprises a plurality of LED chips 2 directly die-bonded onto and linearly arranged in an array on a printed circuit board 1.

The LED chips 2 are arranged a predetermined spacing apart from each other in order to satisfy any requirements in design. In addition, reflection plates 3 are provided between any LED chips inside in order to enhance homogeneity of light directed onto a surface of illumination and also to reduce the total number of the LED chips 2. The reflection plates 3 are made such as of white resin.

A convergent lens 4 in the form of a rod, provided adjacent and parallel to the array of the LED chips 2, is firmly secured by a reflection casing 5 and holders 6 for supporting opposite end faces of the convergent lens 4. This convergent lens 4 serves to converge luminous flux 7 exiting the array of the LED chips 2 into a line within a predetermined range of the illumination surface 8. The convergent lens 4 is made such as of transparent acrylic resin.

Since the luminous flux of the LED array is composed of direct light from the LED chips 2 and indirect light from reflection on the reflection plates 3, the reflection casing 5 or the like, the light converged at the convergent lens 4 is not completely converged on the surface of the document placed on the illumination surface 8. Consequently, such a light ray exists as to be in focus even at a position considerably distant from the surface of the document. This configuration ensures the steady quantity of light required for reading the document even when the surface of the document is curved or when there is a slight error in accuracy in positioning of an optical system.

FIG. 2 shows one example of an optical image reader employing an LED array as a light source. With reference to this figure, the luminous flux 7 which exits the LED chip 2 on the printed plate board 1 is converged at the illumination surface 8 of the document. The entire LED array as a light source is held by a fixing jig 9. The reflected light from the document is again converged at a selfoc lens 10 and then enters a line image sensor 11, in which the information is photoelectrically converted into an electrical signal.

FIG. 3 shows a cross sectional structure of an adhesion type image sensor employing the LED array as a light source. Referring to this figure, in the adhesion type image sensor, light from an LED array 12 used as a light source first illuminates a document surface 14 through an optical fiber array 13 coated with light absorbing material. The light scattered on the document surface 14 is propagated through the optical fiber array 13 and through an optical fiber array 15 coated with light absorbing material and is then introduced into a photodetector 16. The photodetector 16 is shielded by a light shielding fence 23 from direct light from the LED array 12. Image information detected by this, photodetector 16 is processed by an LSI circuit 18 on a base board 17.

The LED array used as a light source is also employed as a light source for a conventional contraction type image sensor employing a contraction optical system. FIGS. 4A and 4B schematically show a comparison between a schematic configuration of the optical system of the contraction type image sensor and that of the adhesion type image sensor shown in FIG. 3. Referring to these figures, in the contraction type image sensor, light emitted from a light source 19 is reflected by a document 20, contracted by an optical lens 21 and then imaged onto a CCD sensor 22. Meanwhile, in the adhesion type image sensor, light which is emitted from the light source 19 and then reflected at the document 20 travels in parallel through an optical fiber array 15 and is then directed onto a photodetector 16 to the same scale as that of image information on the document 20.

During assembly of the conventional LED array used as a light source, as shown in FIGS. 1A–1C, it is required to integrally assemble the printed plate board 1 comprising the LED chips 2 attached thereto, the reflection plates 3, the reflection casing 5, the holders 6 and the convergent rod lens 4 and allow the array of the LED chips 2 and the convergent lens 4 to optically align with each other, thereby preventing an occurrence of an error in relation to relative positioning of these parts. In order to fulfill this requirement, a process for assembling the LED array used as a light source requires a considerably long assembly time and a highly accurate operation.

As described above, the parts are required to be assembled with high accuracy regarding the manufacture of the conventional LED array used as a light source, thereby preventing reductions in cost, size and weight.

Furthermore, in the conventional LED array used as a light source, a bonding area on the printed plate board 1 is required to be plated with noble metal such as gold for direct bonding of the LED chips onto the printed plate board 1. This noble metal plating is necessary because the LED chips 2 are liable to be contaminated with copper ions and thus need to avoid any contact with copper. For this reason, the cost of the LED array has become remarkably increased.

Moreover, the conventional LED array used as a light source has a disadvantage that total reflection at the interface of the LED chips 2 and air-gap, provided between the LED chips 2 and the convergent lens 4, causes a decrease in external quantum efficiency of the LED array.

SUMMARY OF THE INVENTION

It is an object of this invention to provide a light source device with arrayed light emitting elements for achieving a reduction in size and weight of the light source device by reducing the number of parts and for realizing a reduction in cost by facilitating assembly of the parts, and to provide a manufacturing method thereof.

It is another object of this invention to provide a light source device with arrayed light emitting elements, in which an area on a printed circuit board onto which the light emitting element array is bonded need not be subject to noble metal plating.

It is a further object of this invention to provide a light source device with arrayed light emitting elements for preventing a decrease in external quantum efficiency.

A light source device with arrayed light emitting elements according to this invention includes a base board on which a plurality of light emitting elements are arranged in an array, a convergent lens in the form of a rod, provided parallel to the array of the light emitting elements, and a reflection casing for holding this convergent lens. In this light source device with arrayed light emitting elements, the convergent lens and the reflecting casing are connected with each other to form a air-gap parallel to the convergent lens, and the base board is secured as being inserted in the air-gap.

According to this invention, due to the configuration in which the convergent lens and the reflection casing are integrally formed in advance, an assembly process for the light source device requires no highly accurate adjustments in relative positioning of the parts. Since the light emitting elements arranged are positioned by inserting the base board into the air-gap, it is easy to align the light emitting elements along an optical axis of the convergent lens.

A method of manufacturing the light source device with arrayed light emitting elements according to the present invention includes the step of integrally molding the convergent rod lens and the reflection casing parallel with each other by continuous two-color exclusion, with the air-gap formed in the form of tunnel, and the step of inserting the base board on which the plurality of light emitting elements are arranged in an array into the air-gap and securing the base board into the reflection casing.

According to the present invention, since the convergent rod lens and the reflection casing are simultaneously molded as being automatically positioned with each other by this method, the assembly process for the light device requires no highly accurate adjustments in relative positioning of the parts. Therefore, the manufacturing process is simplified, resulting in a decrease in cost. The light source device with arrayed light emitting elements, according to another aspect of the present invention, is configured such that super-miniature LED lamps formed of LED chips molded with light transmissive resin are arranged on the base board.

This configuration, according to the present invention, prevents total reflections at the surfaces of light emission of the LED chips and thus enables an enhancement in external quantum efficiency of the light emitting elements.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, features, aspects and advantages of the present invention will become more apparent from the following detailed description of the present invention when taken in conjunction with the accompanying drawings, which are given by way of illustration only and thus are not limitative of the present invention and wherein.

DESCRIPTION OF THE PREFERRED EMBODIMENTS

Figure 1A:
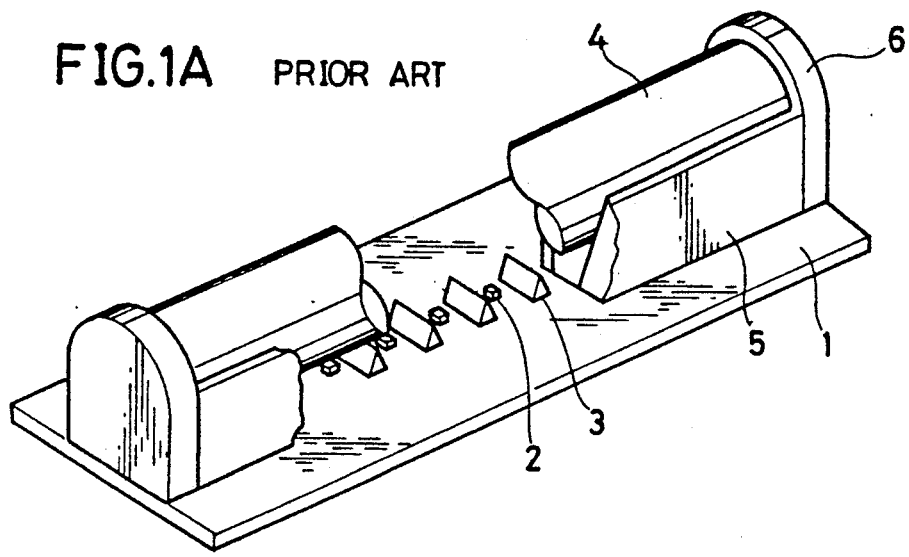
FIG. 1A is a perspective view showing the structure of a conventional light source device with arrayed light emitting elements.
Figure 1B:
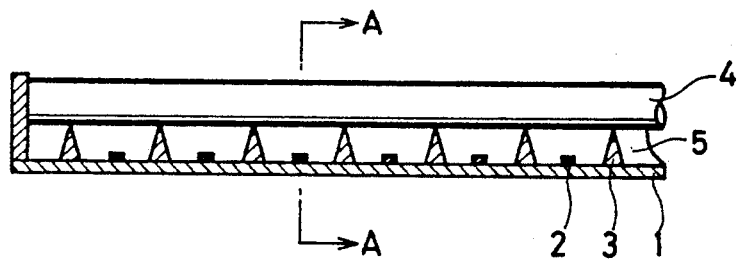
FIG. 1B is a central cross sectional view in the elongated direction of the conventional light source device of FIG. 1A.
Figure 1C:
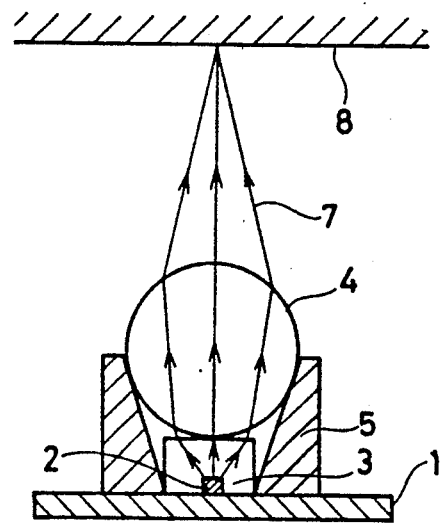
FIG. 1C is a cross sectional view taken in the direction of arrows A—A of FIG. 1B.
Figure 2:
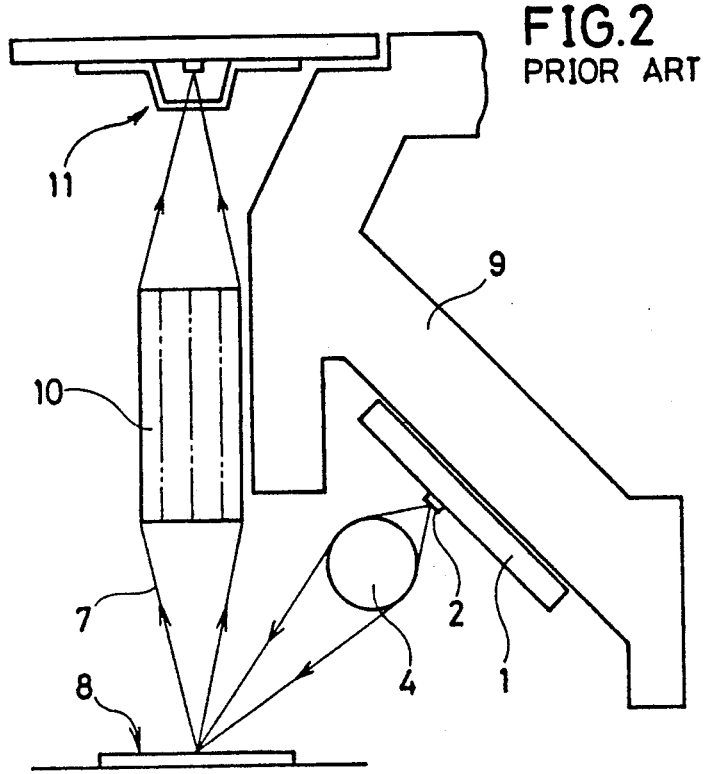
FIG. 2 is a view showing an example of the configuration of an optical image reader employing the conventional LED array as a light source.
Figure 3:
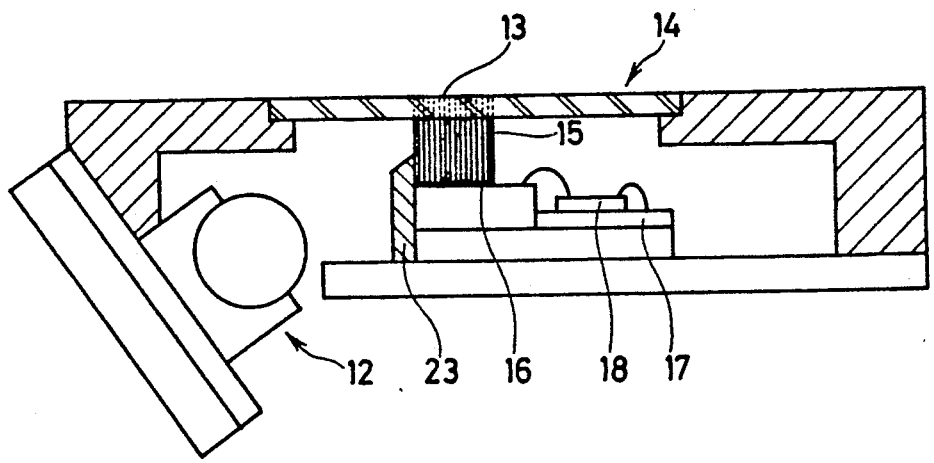
FIG. 3 is a cross sectional view of an adhesion type image sensor employing the conventional LED array as a light source.
Figure 4A:
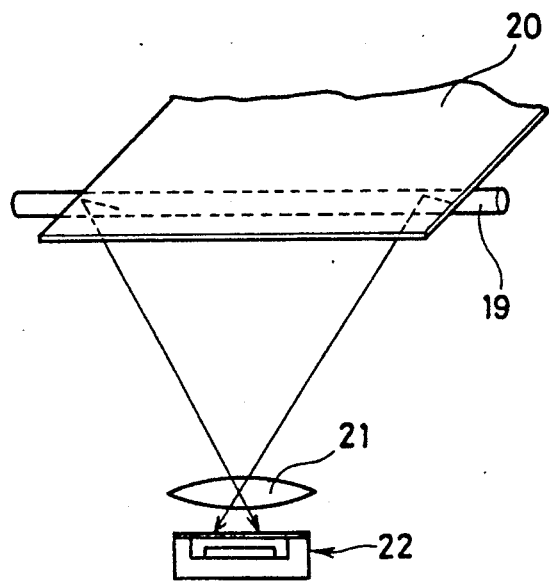
FIGS. 4A and 4B are perspective views showing a comparison between the schematic configuration of an optical system of a conventional contraction type image sensor and that of a conventional adhesion type image sensor, respectively.
Figure 4B:
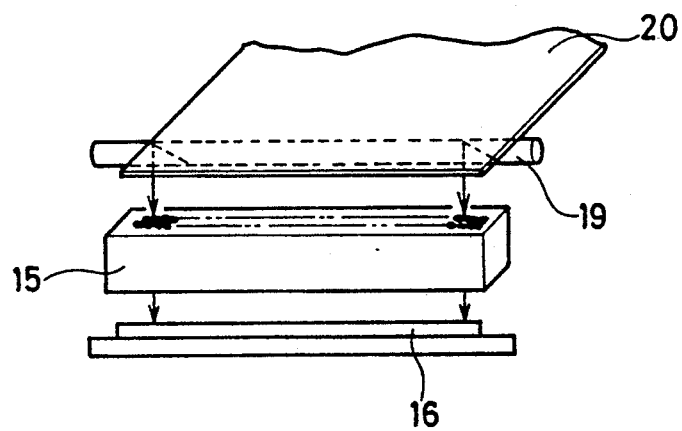
Figure 5:
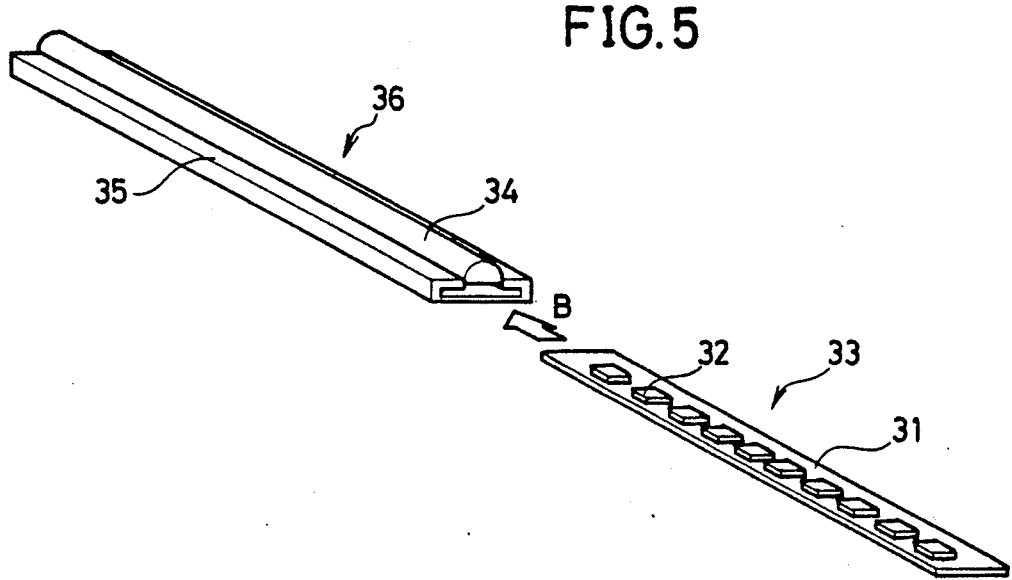
FIG. 5 is an exploded perspective view of a light source device with arrayed light emitting elements according to an embodiment of the present invention.

The first embodiment of the present invention will now be described with reference to FIGS. 5-7. Referring to FIG. 5, a light source device with arrayed light emitting elements according to this embodiment comprises a printed circuit board 33, on which a plurality of super-miniature LED lamps 32 are linearly arranged on a printed plate board 31 used as a base board, and a casing 36 with a lens comprising a convergent rod lens 34 with a roughly semicircular cross section and a reflecting casing 35.

Figure 6A:
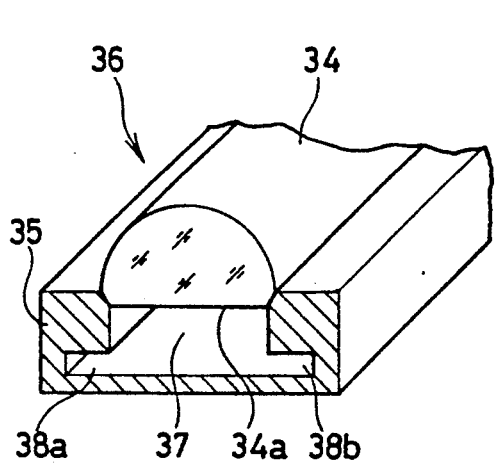
FIG. 6A is a sectional perspective view showing only a convergent rod lens and a reflecting casing of a light source device with arrayed light emitting elements according to a first embodiment of the present invention.
Figure 6B:
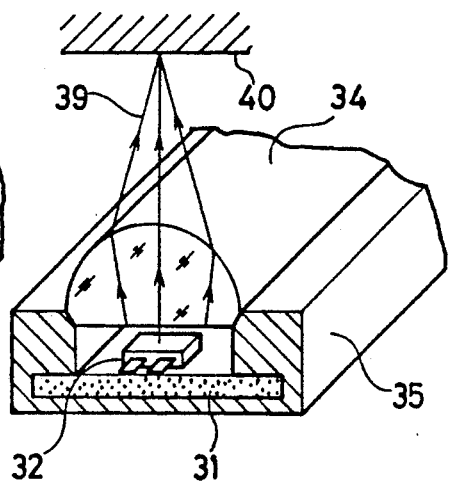
FIG. 6B is a sectional perspective view of the light source device with arrayed light emitting elements according to the first embodiment.

As shown in FIG. 6A, the casing 36 forms therein air-gap 37 in the form of a tunnel, and has the convergent lens 34 and reflection casing 35 integrally connected. Grooves 38a and 38b are formed in parallel at the inner left and right sides of the reflection casing 35, in the elongated direction of the casing 36. Inserting the printed circuit board 33 with LEDs in the direction of the arrow B shown in FIG. 5 and fitting both left and right sides of the printed plate board 31 in the grooves 38a and 38b forms a light source device with arrayed light emitting elements as shown in FIG. 6B. Luminous flux 39 emitted from the super-miniature LED lamps 32 is converged at the convergent lens 34 and is then focussed near the surface 40 of a document.

Figure 7:
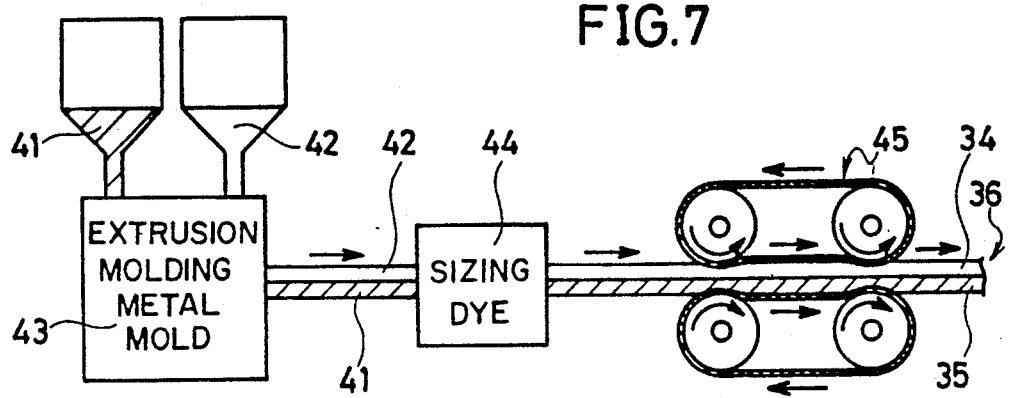
FIG. 7 is a view schematically showing a process for continuous two-color extrusion molding for integrally molding the convergent lens and the reflection casing according to the first embodiment.

The casing 36 can also be molded by continuous two-color extrusion molding as shown in FIG. 7 as well as it is formed by connecting the convergent lens 34 and the reflection casing 35 which are separately molded. This continuous two-color extrusion molding supplies transparent resin 42, such as pressure-resistive transparent acrylic resin which is a material of the convergent lens 34 and white resin 41, such as white Noryl resin, which is a material of the reflection casing 35 into an extrusion molding metal mold 43. The transparent resin 42 and white resin 41 are molded in the form of the cross sections of the convergent lens 34 and the reflection casing 35 in this extrusion molding metal mold 43, extruded as they are connected together, and cut into a predetermined length by a sizing die 44. The casing 36 with the lens thus molded is carried on a pull-out belt 45 to the assembly step in which the casing 36 is assembled with the printed circuit board 33 with LEDs.

Manufacturing the casing 36 by the above described continuous two-color extrusion molding results not only in a simplified manufacturing process but also in positional adjustment of the convergent lens 34 and the reflection casing 35 at the time of molding. Consequently, positional adjustment of the optical system is eliminated compared to the case in which the convergent lens 34 and the reflection casing 35 are separately molded and then connected together.

In accordance with this embodiment, an external dimension of the reflection casing 35 is 3.0mm in height, 8.0mm in width and 227mm in length, and that of the convergent lens 34 is 2.25mm in radius of curvature of its cylindrical surface, 2.25mm in thickness and 227mm in length. Thus, they are mainly employed as a light source for reading documents of A4 size.

Figure 8:
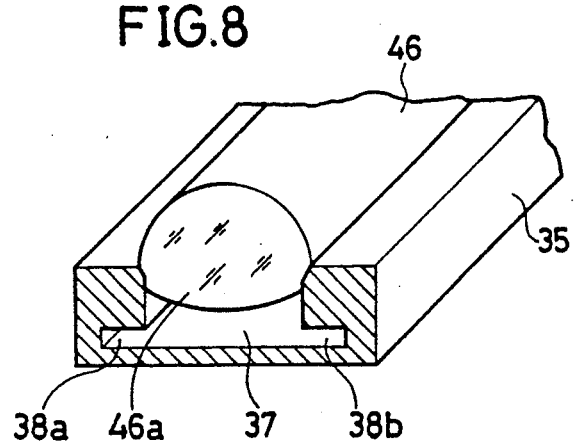
FIG. 8 is a sectional perspective view showing only a convergent lens and a reflection casing of a light source device with arrayed light emitting elements according to a second embodiment of the present invention.
Figure 9A:
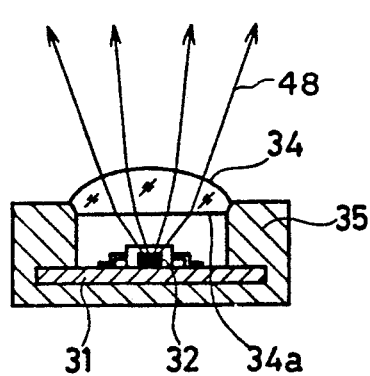
FIGS. 9A and 9B are cross sectional views showing a difference between luminous flux of the first embodiment and that of the second embodiment, respectively, in accordance with the present invention.
Figure 9B:
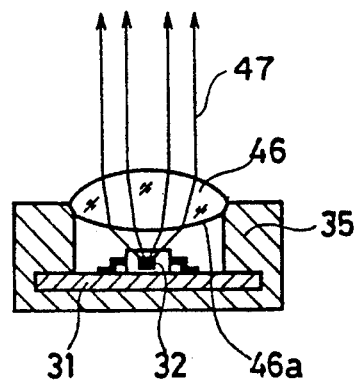

The second embodiment of the present invention will now be described with reference to FIG. 8. This embodiment is different from the first embodiment with respect to the shape of the surface of each convergent lens facing the super-miniature LED lamps 32. That is, while the convergent lens 46 in the first embodiment has a the roughly semicircular cross section and has a surface 34a thereof facing the super-miniature LED lamps 32 which is flat or planar, a convergent lens 46 in the second embodiment has a convex surface 46a facing the super-miniature LED lamp 32. A comparison in luminous flux between the first and second embodiments is shown in FIGS. 9A and 9B. Luminous flux 47 of the second embodiment has better convergency than that of luminous flux 48 of the first ,embodiment after exiting convergent lenses 46 and 34, respectively. This is due to the fact that a focal length of the convergent lens 46 is shorter than that of the convergent lens 34 because the surface 46a is curved in convexly.

Figure 10A:
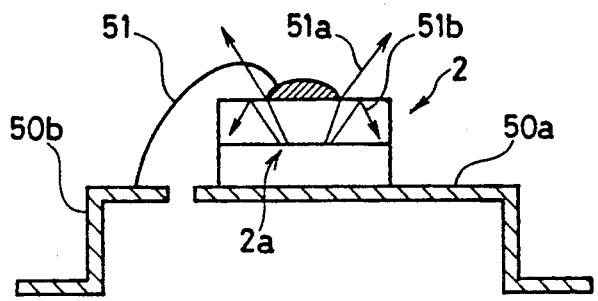
FIG. 10A is a cross sectional view showing the state of light emission and total reflection of a conventional LED chip.
Figure 10B:
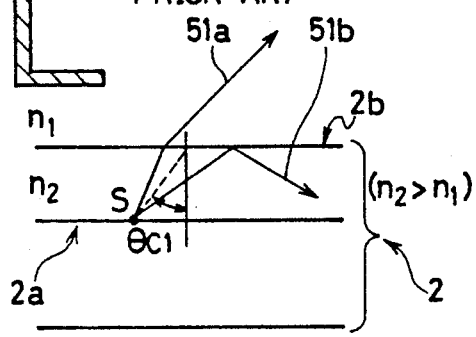
FIG. 10B is a diagram for describing a relationship between the total reflection and refractive index.
Figure 11A:
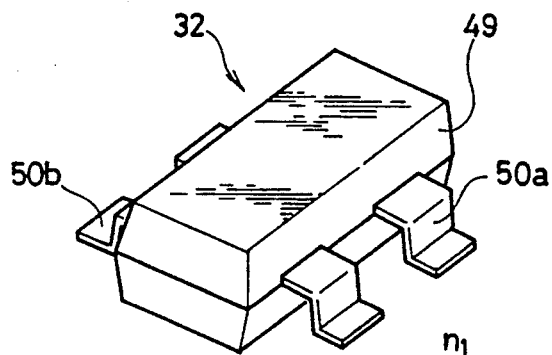
FIG. 11A is a perspective view of a super-miniature LED lamp molded with resin in the light source device with arrayed light emitting elements according to the, first and second embodiments of the present invention.
Figure 11B:
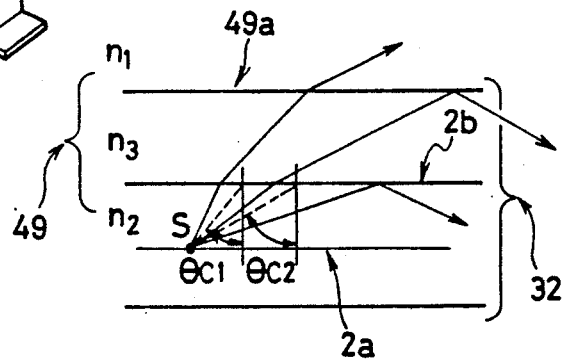
FIG. 11B is a diagram for describing a relationship between luminous flux and refractive index thereof.

Description will now be given on the super-miniature LED lamp 32 in each embodiment described above. The super-miniature LED lamp 32 is formed such that the outside of the conventional LED chip 2 shown in FIG. 10A is molded with light transmissive resin 49 as shown in FIG. 11A. The conventional LED chip 2 shown in FIG. 10A is adhered onto a frame 50a and bonding-connected to a frame 50b by wire 51. The frames 50a and 50b have horizontally extended end portions as shown and the overall structure is generally referred to as the flat package type. A flat package type LED may be mounted on a base board without providing through-holes therein. In the case of the conventional LED chip, since the relation between refractive index $n_1$ in the air-gap and refractive index $n_2$ in the LED chip 2 are given by $n_2 > n_1$, a portion of light emitted from a light emitting portion 2a totally reflects at an interface 2b. That is, a large portion of luminous flux 51a whose incident angle from one light emitting point S on the light emitting portion 2a to the interface 2b is smaller than a certain critical angle $\theta_{c1}$ is transmitted through the interface 2b, while luminous flux 51b whose incident angle to the interface 2b is larger than the critical angle $\theta_{c1}$ totally reflects at the interface 2b. This total reflection decreases external quantum efficiency which represents efficiency in the quantity of light finally discharged outside, with overall current flowing through the LED chip 2 as a reference. On the other hand, in the case of the super-miniature LED lamp molded with light transmissive resin, as shown in FIG. 11B, the relation between refractive index $n_3$ in a light transmissive resin layer 49 and the other refractive indexes $n_1$, $n_2$ is usually given by $n_2 > n_3 > n_1$. Therefore, a critical angle $\theta_{c2}$ at an interface 2b becomes larger than the critical angle $\theta_{c1}$, and thus total reflection at the interface 2b decreases more than that in the case of FIG. 10B. Therefore, if the convergent lens 34 with the same refractive index as $n_3$ is adhered onto the surface of the light transmissive resin layer 49, luminous flux whose incident angle to the interface 2b is smaller than the critical angle $\theta_{c2}$ is discharged outside without totally reflecting. However, when the luminous flux goes through the air-gap without the convergent lens adhered onto the surface of the light transmissive resin layer 49, as shown in FIG. 11B, luminous flux 51c whose incident angle to the interface 2b is larger than the critical angle $\theta_{c1}$ totally reflects eventually at an interface 49a even though the incident angle to the interface 2b is smaller than the critical angle $\theta_{c2}$. Thus, the decrease in external quantum efficiency due to the total reflection cannot be prevented in this case. However, since the luminous flux is emitted from the interface 49a of the light transmissive resin layer 49 and the air-gap, this case has an advantage that an allowable tolerance in relative positional adjustment of the LED chip 2 and the convergent lens 34 or 46 becomes somewhat larger compared to the case with the LED chip 2 molded with no light transmissive resin, in which case light is emitted from a point light source. An error range in the relative positional adjustment of the no light transmissive resin-molded LED chip and the convergent lens need usually be kept within ±0.15mm. Therefore, the allowable tolerance is increased several times by molding of the light transmissive resin, thereby further facilitating the assembly of the light source device with arrayed light emitting elements.

Figure 12A:
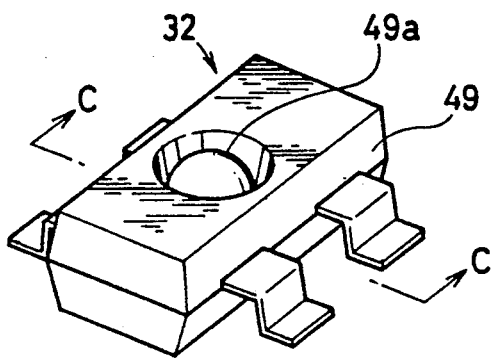
FIG. 12A is a perspective view of a super-miniature LED lamp in a light source device with arrayed light emitting elements according to a third embodiment of the present invention.
Figure 12B:
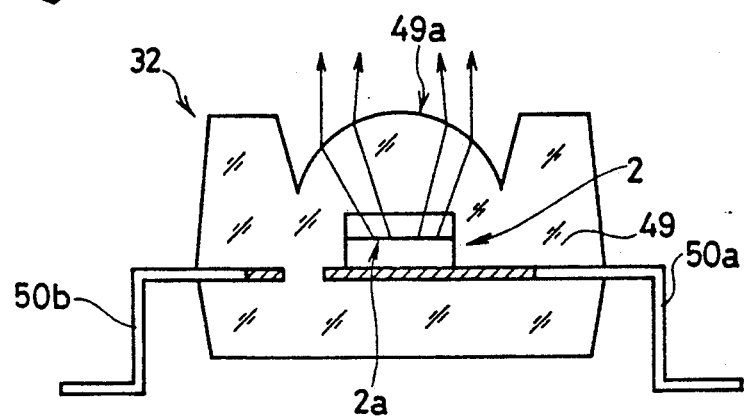
FIG. 12B is a cross sectional view taken in the direction of arrows C—C of FIG. 12A.
Figure 12C:
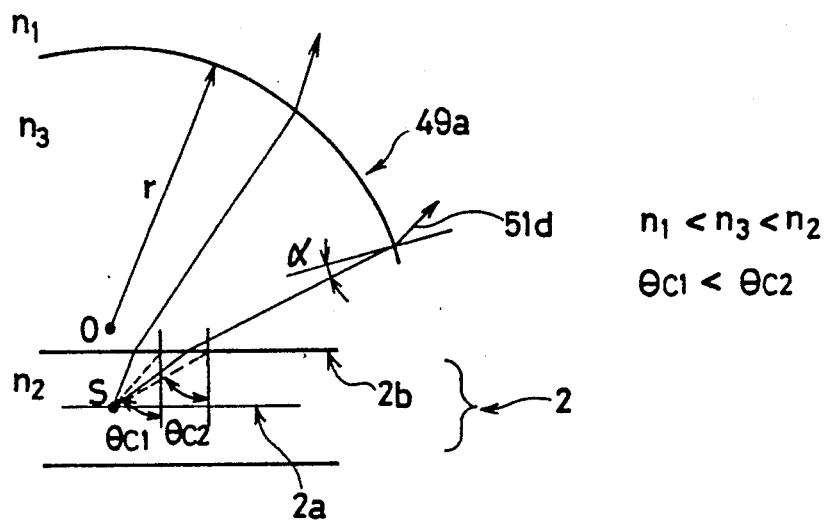
FIG. 12C is a diagram for describing a relationship between luminous flux and refractive index thereof.

A third embodiment of the present invention will be described with reference to FIGS. 12A–12C. This embodiment is characterized in that a lens portion 49a with a convex surface is formed on the outer surface of the light transmissive resin layer 49 molding the LED chip 2. With provision of this lens portion 49a, even if the incident angle to the interface 2b is larger than the critical angle $\theta_{c1}$, luminous flux 51d transmitted through the interface 2b provides an incident angle $\alpha$ into the surface of the lens portion 49a smaller than a critical angle at the surface of the lens portion 49a because a normal direction of the surface of the lens portion 49a becomes a reference. Consequently, a proportion of the luminous flux totally reflecting is reduced, resulting in an enhancement n external quantum efficiency of the super-miniature LED lamp. In addition, as shown in FIG. 12C, when the radius of curvature of the lens portion 49a is represented by r and the center of curvature O is positioned closer to the surface of the lens portion 49a than the light emitting point S, all the luminous flux emitted from the point S and then from the surface of the lens portion 49a refracts in the direction of convergence. Consequently, employment of the super-miniature LED lamp of this embodiment enables enhancements not only in external quantum efficiency but also in the convergency of the luminous flux.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light source device with arrayed light emitting elements, comprising:
    a base board on which a plurality of said light emitting elements are arranged in an array;
    a convergent lens in the form of a rod, provided parallel to the array of said light emitting elements; and
    a reflection casing for holding said convergent lens, said convergent lens and said reflection casing being connected with each other and forming an air-gap parallel to said convergent lens,
    said base board being secured upon insertion into said air-gap.

2. The light source device with arrayed light emitting elements in accordance with claim 1, said convergent lens and said reflection casing are integrally molded by continuous two-color extrusion molding.

3. The light source device with arrayed light emitting elements in accordance with claim 1, said convergent lens is formed of a convex rod lens with a planar surface facing said light emitting elements and an external surface curved convexly.

4. The light source device with arrayed light emitting elements in accordance with claim 1, said convergent lens is formed of a convex rod lens with both a surface facing said light emitting elements and an external surface curved convexly.

5. The light source device with arrayed light emitting elements in accordance with claim 1, each of said light emitting elements is formed of a super-miniature LED lamp comprising an LED chip molded with light transmissive resin.

6. The light source device with arrayed light emitting elements in accordance with claim 5, each of said light emitting elements comprising a lens portion with a surface curved convexly and formed on an outer surface of a layer of said light transmissive resin.

7. The light source device with arrayed light emitting elements in accordance with claim 5, each of said super-miniature LED lamps is of a flat package type which is mounted on said base board without the necessity of through-holes formed therein.

8. The light source device with arrayed light emitting elements in accordance with claim 1, said base board is secured in said reflection casing so that left and right sides of said base board fit in grooves formed parallel to said convergent lens inside said reflection casing.

9. A method of manufacturing a light source device with arrayed light emitting elements, comprising the steps of:
    integrally molding a convergent rod lens and a reflection casing in parallel with each other by continuous two-color extrusion, with an air-gap formed in the form of tunnel; and
    inserting a base board on which a plurality of said light emitting elements are arranged in an array into said air-gap, and securing said base board in said reflection casing.

10. The method of manufacturing a light source device with arrayed light emitting elements in accordance with claim 9, said method further comprising forming grooves parallel to an elongated direction of said convergent rod lens along said air-gap inside said reflection casing when the continuous two-color extrusion is carried out and inserting said base board into said air-gap with side ends of said base board fit in said grooves.

11. The method of manufacturing a light source device with arrayed light emitting elements in accordance with claim 9, said continuous two-color extrusion comprises using transparent resin as a material of said convergent lens and reflective opaque resin as a material of said reflection casing.

12. The method of manufacturing a light source device with arrayed light emitting elements in accordance with claim 9, said continuous two-color extrusion comprises using transparent acrylic resin as a material of said convergent lens and white Noryl resin as a material of said reflection casing.

13. The method of manufacturing a light source device with arrayed light emitting elements in accordance with claim 9, said light emitting elements are of a flat package type and are mounted on said base board without the use of through-holes formed therein.

* * * * *